US011251170B2

(12) United States Patent
Chang Chien et al.

(10) Patent No.: US 11,251,170 B2
(45) Date of Patent: Feb. 15, 2022

(54) PACKAGE STRUCTURE AND MANUFACTURING METHOD THEREOF

(71) Applicant: Powertech Technology Inc., Hsinchu County (TW)

(72) Inventors: Shang-Yu Chang Chien, Hsinchu County (TW); Hung-Hsin Hsu, Hsinchu County (TW); Nan-Chun Lin, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 37 days.

(21) Appl. No.: 16/398,246

(22) Filed: Apr. 29, 2019

(65) Prior Publication Data
US 2020/0343231 A1  Oct. 29, 2020

(51) Int. Cl.
*H01L 25/16* (2006.01)
*H01L 23/31* (2006.01)
*H01L 23/498* (2006.01)
*H01L 23/00* (2006.01)
*H01L 21/56* (2006.01)
(Continued)

(52) U.S. Cl.
CPC ........ *H01L 25/165* (2013.01); *H01L 21/4817* (2013.01); *H01L 21/4857* (2013.01); *H01L 21/565* (2013.01); *H01L 23/053* (2013.01); *H01L 23/3128* (2013.01); *H01L 23/49822* (2013.01); *H01L 24/16* (2013.01); *H01L 24/32* (2013.01); *H01L 23/367* (2013.01); *H01L 23/552* (2013.01); *H01L 28/10* (2013.01); *H01L 28/20* (2013.01); *H01L 28/40* (2013.01); *H01L 2224/16227* (2013.01); *H01L 2224/32245* (2013.01)

(58) Field of Classification Search
CPC .......................... H01L 25/0655; H01L 25/072
See application file for complete search history.

(56) References Cited

U.S. PATENT DOCUMENTS 7,880,282 B2  2/2011  Holland
10,068,854 B2  9/2018  Lee et al.
(Continued)

OTHER PUBLICATIONS

"Office Action of Taiwan Counterpart Application", dated Aug. 10, 2020, p. 1-p. 7.
(Continued)

*Primary Examiner* — Moazzam Hossain
*Assistant Examiner* — Hajar Kolahdouzan
(74) *Attorney, Agent, or Firm* — JCIPRNET

(57) ABSTRACT

A package structure including a frame structure, a die, an encapsulant, a redistribution structure, and a passive component is provided. The frame structure has a cavity. The die is disposed in the cavity. The encapsulant fills the cavity to encapsulate the die. The redistribution structure is disposed on the encapsulant, the die, and the frame structure. The redistribution structure is electrically coupled to the die. The passive component is disposed on the frame structure and electrically coupled to the redistribution structure through the frame structure. A manufacturing method of a package structure is also provided. The frame structure may provide support, reduce warpage, dissipate heat from the die, act as a shield against electromagnetic interference, and/or provide electrical connection for grounding.

20 Claims, 12 Drawing Sheets

(51) Int. Cl.
*H01L 21/48* (2006.01)
*H01L 23/053* (2006.01)
*H01L 49/02* (2006.01)
*H01L 23/367* (2006.01)
*H01L 23/552* (2006.01)

(56) References Cited

U.S. PATENT DOCUMENTS

| | | |
|---|---|---|
| 2012/0112326 A1 | 5/2012 | Pagaila et al. |
| 2013/0105989 A1* | 5/2013 | Pagaila ............... H01L 25/0655 257/774 |
| 2013/0249104 A1* | 9/2013 | Chi .................. H01L 23/49822 257/774 |
| 2015/0348936 A1 | 12/2015 | Lin et al. |
| 2018/0301418 A1* | 10/2018 | Chang Chien ...... H01L 21/4857 |
| 2019/0273030 A1* | 9/2019 | Lim .................. H01L 23/49838 |

OTHER PUBLICATIONS

"Office Action of Taiwan Counterpart Application", dated Nov. 17, 2020, p. 1-p. 4.

\* cited by examiner

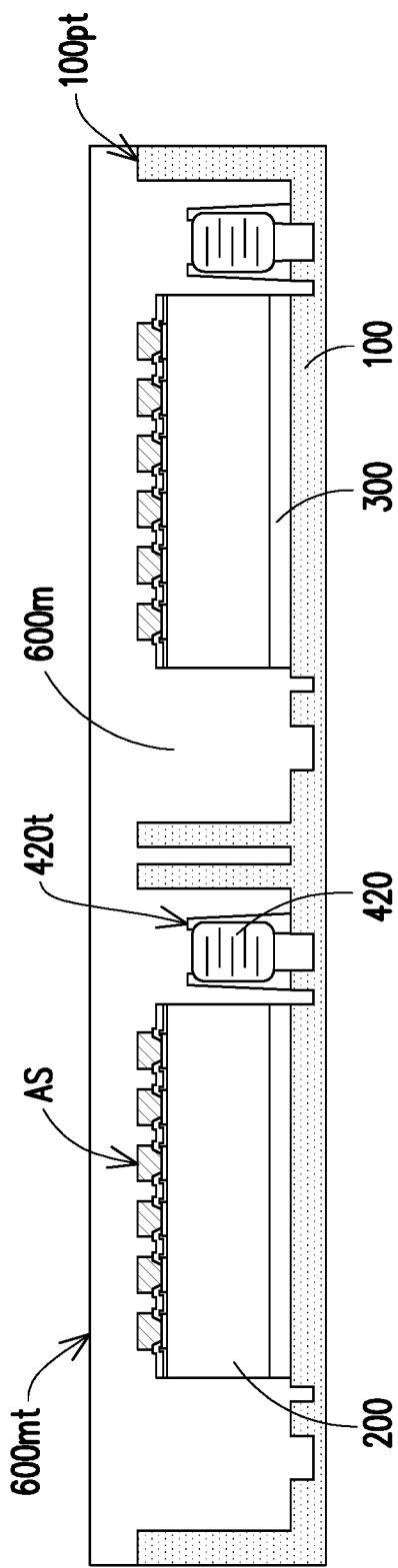
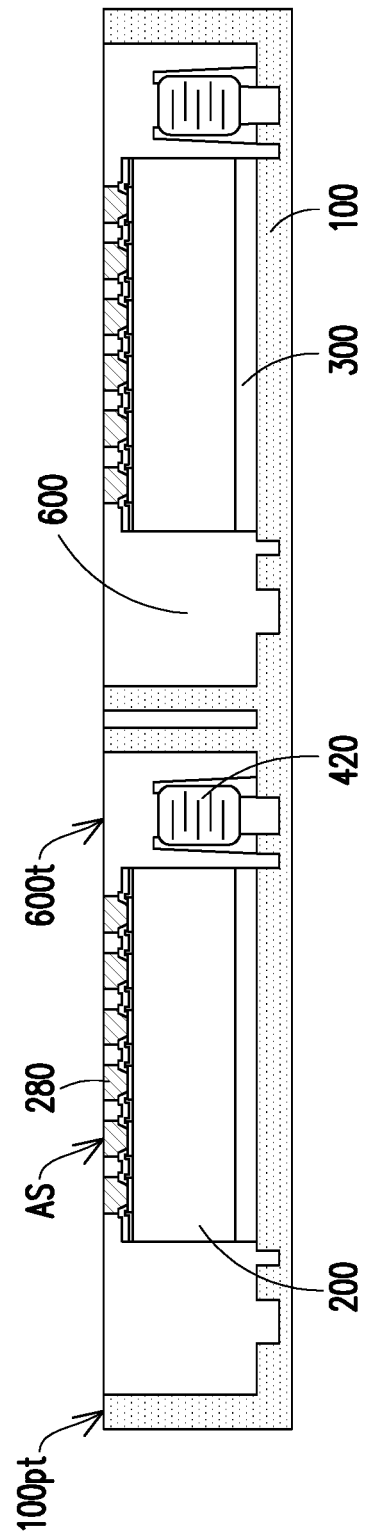
FIG. 1E
FIG. 1F

PACKAGE STRUCTURE AND MANUFACTURING METHOD THEREOF

BACKGROUND OF THE INVENTION

Field of the Invention

The disclosure generally relates to a package structure and a manufacturing method thereof, and in particular, to a package structure having a frame structure and an integrated passive component and a manufacturing method of the package structure.

Description of Related Art

Development of semiconductor package technology in recent years has focused on delivering products with smaller volume, lighter weight, greater integration, and lower manufacturing cost. Continuing to miniaturize the package structure while keeping the cost of manufacturing low and the performance of the packaged semiconductor die high continues to be a challenge to researchers in the field.

SUMMARY OF THE INVENTION

The disclosure provides a package structure and a manufacturing method thereof, which provides passive component integration while effectively enhancing the reliability of the package structure at a lower manufacturing cost.

The disclosure provides a package structure including a frame structure, a die, an encapsulant, a redistribution structure, and a passive component. The frame structure has a cavity. The die is disposed in the cavity. The encapsulant fills the cavity to encapsulate the die. The redistribution structure is disposed on the encapsulant, the die, and the frame structure. The redistribution structure is electrically coupled to the die. The passive component is disposed on the frame structure and electrically coupled to the redistribution structure through the frame structure.

The disclosure provides a manufacturing method of a package structure. The method includes at least the following steps. A frame structure having a cavity is provided. A die is placed in the cavity of the frame structure. An encapsulant is formed in the cavity of the frame structure to encapsulate the die. A redistribution structure is formed over the encapsulant, the die, and the frame structure. The die and the frame structure are electrically coupled to the redistribution structure. A passive component is placed on the frame structure such that the passive component is electrically coupled to the redistribution structure through the frame structure.

Based on the above, the frame structure within the package structure serves as electrical connection between the passive component and the redistribution structure. Thus, the conventional use of conductive pillars for connection through the encapsulation layer to the redistribution layer may be eliminated. In other words, the costly tall pillar plating process in a conventional manufacturing process of the package structure may be removed to reduce the cost of fabrication. The frame structure may also serve as a carrier during the manufacturing process of the package structure. Thus, the use of a temporary carrier may be eliminated. In other words, the costly transfer bonding process performed in the conventional manufacturing process of the package structure may be removed to reduce the cost of fabrication. Moreover, since the frame structure may be formed by rigid materials, the frame structure is able to provide rigidity and strength to the package structure, while keeping the package structure thin. As such, the problems of panel warpage and package chipping/breaking/cracking may be sufficiently prevented, thereby increasing the yield and the reliability of the package structure. Furthermore, the frame structure may also serve the function of heat dissipation and electromagnetic interference (EMI) shielding. As a result, the performance of the package structure having integrated passive components may be further enhanced.

To further explain the aforementioned, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles presented in the disclosure. Identical or similar numbers refer to identical or similar elements throughout the drawings.

FIG. 1A to FIG. 1J are schematic cross-sectional views illustrating a manufacturing method of a package structure according to an embodiment of the disclosure.

DESCRIPTION OF THE EMBODIMENTS

Figure 1A:
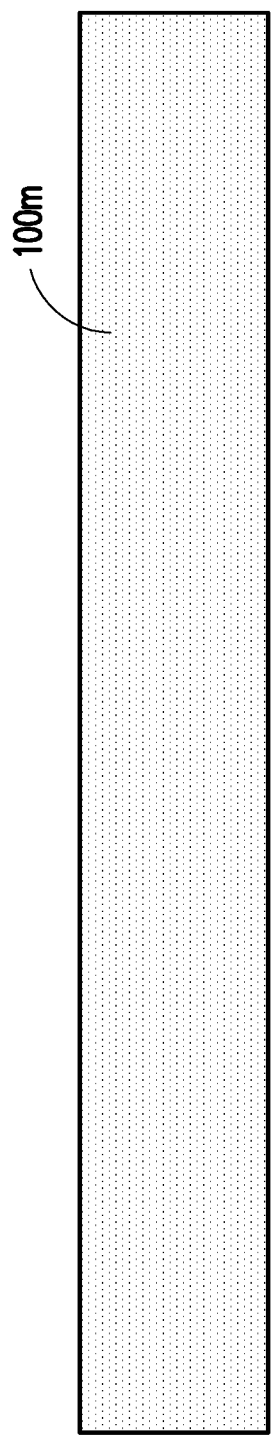

Reference will now be made in detail to the present preferred embodiments of the invention, examples of which are illustrated in the accompanying drawings. Wherever possible, the same reference numbers are used in the drawings and the description to refer to the same or like parts.

Figure 1B:
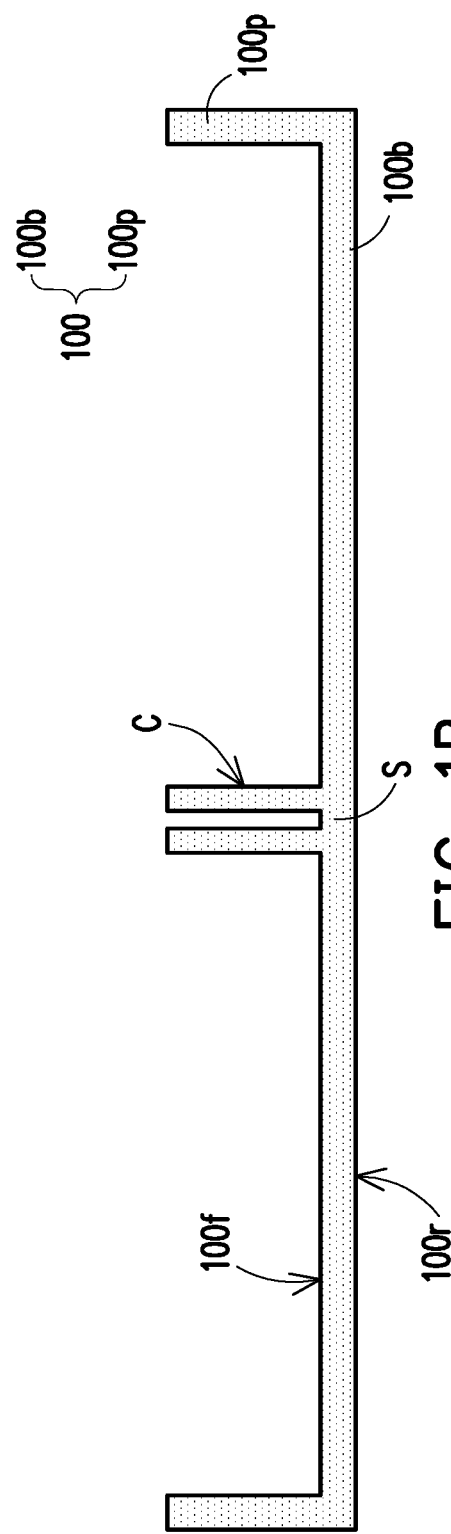

FIG. 1A to FIG. 1J are schematic cross-sectional views illustrating a manufacturing method of a package structure 10 according to an embodiment of the disclosure. FIG. 2 is a top view of an intermediate step in a manufacturing method of a package structure 10 shown in FIG. 1B according to an embodiment of the disclosure. Referring to FIG. 1A, a plate 100m is provided. The plate 100m may be made of a conductive material. For example, the material of the plate 100m includes copper, metallic alloy, steel, or a combination thereof. Referring to FIG. 1B, a portion of the plate 100m may be removed or the plate 100m may be shaped to form a frame structure 100. For example, the plate 100m may by etched or punched to form the frame structure 100. The etching process may include a wet etching process or a dry etching process. The frame structure 100 has a first surface 100f and a second surface 100r opposite to the first surface 100f. The frame structure 100 includes a body 100b and a plurality of protrusions 100p protruding from the body 100b. For example, the protrusions 100p may protrude from the first surface 100f of the frame structure 100. In some embodiments, the body 100b and each of the protrusions 100p are configured to form a cavity C. For example, the protrusion 100p may form a closed loop as seen from a top view as shown in FIG. 2, thereby defining the cavity C enclosed by the protrusion 100p. It should be noted that the cross-sectional view shown in FIG. 1B corresponds to cross-sectional line A-A' in FIG. 2. Although the protrusion 100p is illustrated as a rectangular closed loop, the shape thereof is not limited thereto. In some alternative embodiments, the protrusion 100p may take the form of a circular closed loop, a polygonal closed loop, or any other closed loop. In some embodiments, a portion of the first surface 100f of the frame structure 100 may also be referred to as a bottom surface of the cavity C. In some embodiments, the frame structure 100 has a plurality of cavities C defined by the body 100b and the protrusions 100p. In some embodiments, the cavities C may be arranged in an array as shown in FIG. 2. For simplicity, only two adjacent cavities C are illustrated in FIG. 1B and four adjacent cavities C are illustrated in FIG. 2.

In some embodiments, a scribe line S may also be formed in the frame structure 100. The scribe line S is a thinner portion of the frame structure 100 that facilitates cutting along the scribe line S to produce single package structures from, for example, an array of package structures integrally formed from a panel. In some embodiments, the scribe line S may be formed in the protrusion 100p of the frame structure 100 in between adjacent cavities C. For example, the scribe line S may be formed as a closed loop around each cavity C as shown in FIG. 2. The frame structure 100 may by etched or punched to form the scribe line S. In some embodiments, the scribe line S may be formed in the same step as forming the cavity C. As shown in FIG. 1B, the scribe line S may have a same depth as the cavity C, but the disclosure is not limited thereto.

In some embodiments, the frame structure 100 may be formed from a conductive substrate to provide electrical connection therethrough and for isolation and protection against electromagnetic interference (EMI). The frame structure 100 may have a high strength and stiffness to provide structural support. The frame structure 100 may be made of a material having low thermal capacity and high thermal dissipation, such that the frame structure 100 may act as a heatsink to dissipate heat generated from the subsequently formed components. For example, the material of the frame structure 100 may include copper, a metallic alloy, steel, other suitable materials, or a combination thereof.

Figure 1C:
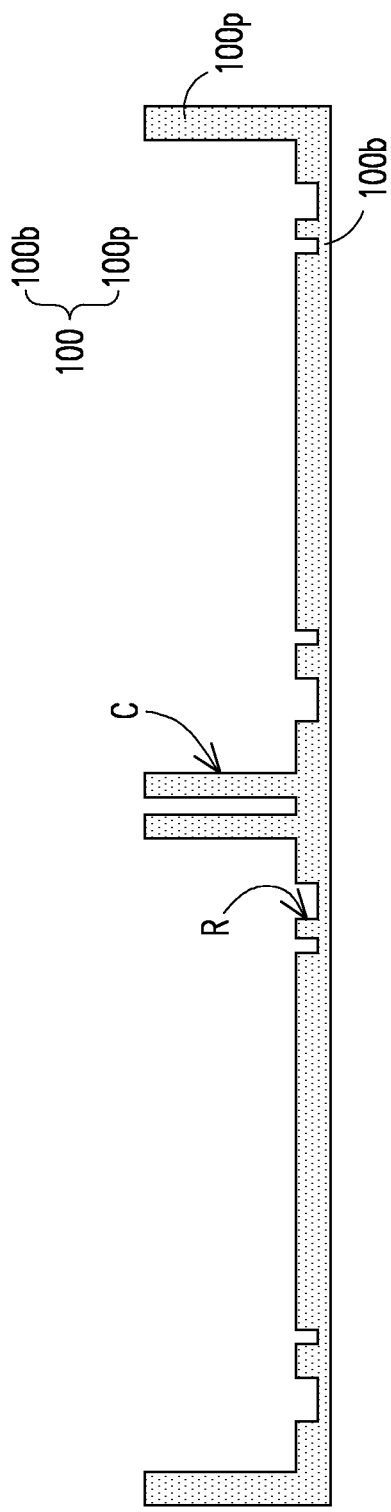
Figure 2:
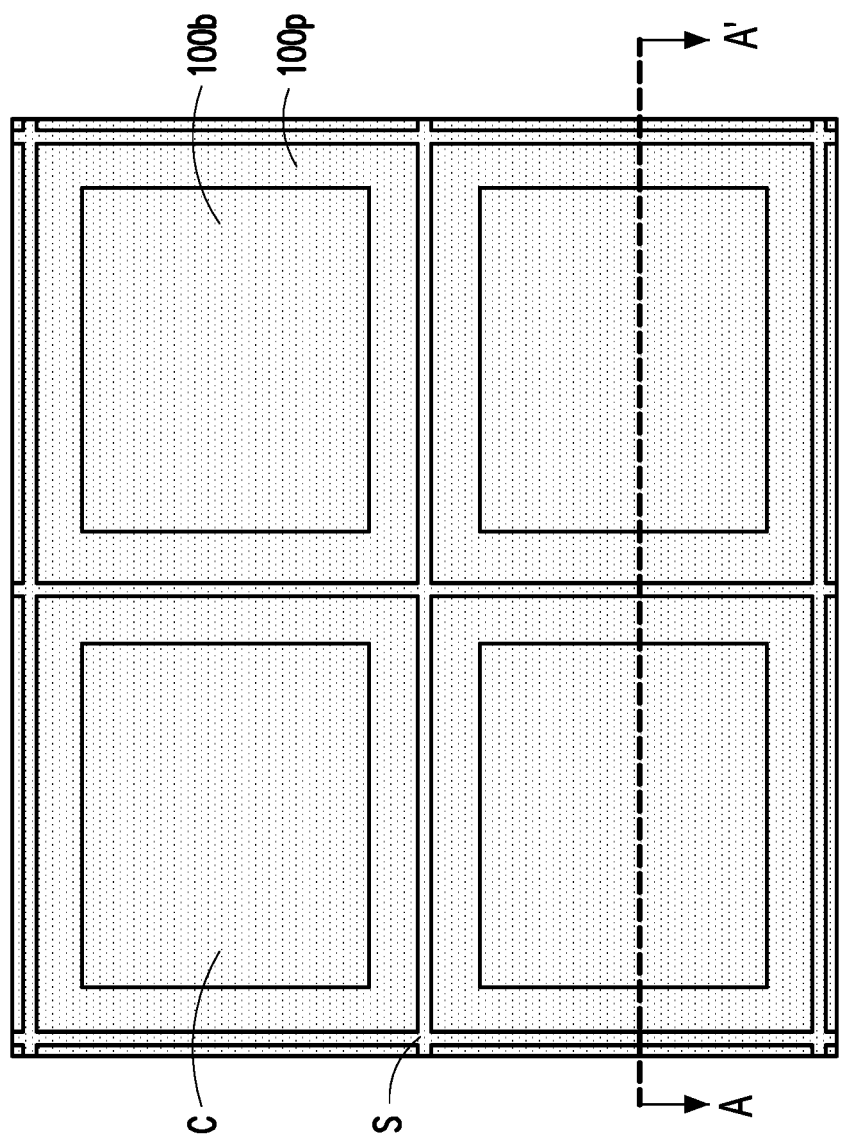
FIG. 2 is a top view of an intermediate step in a manufacturing method of a package structure shown in FIG. 1B according to an embodiment of the disclosure.
Figure 3:
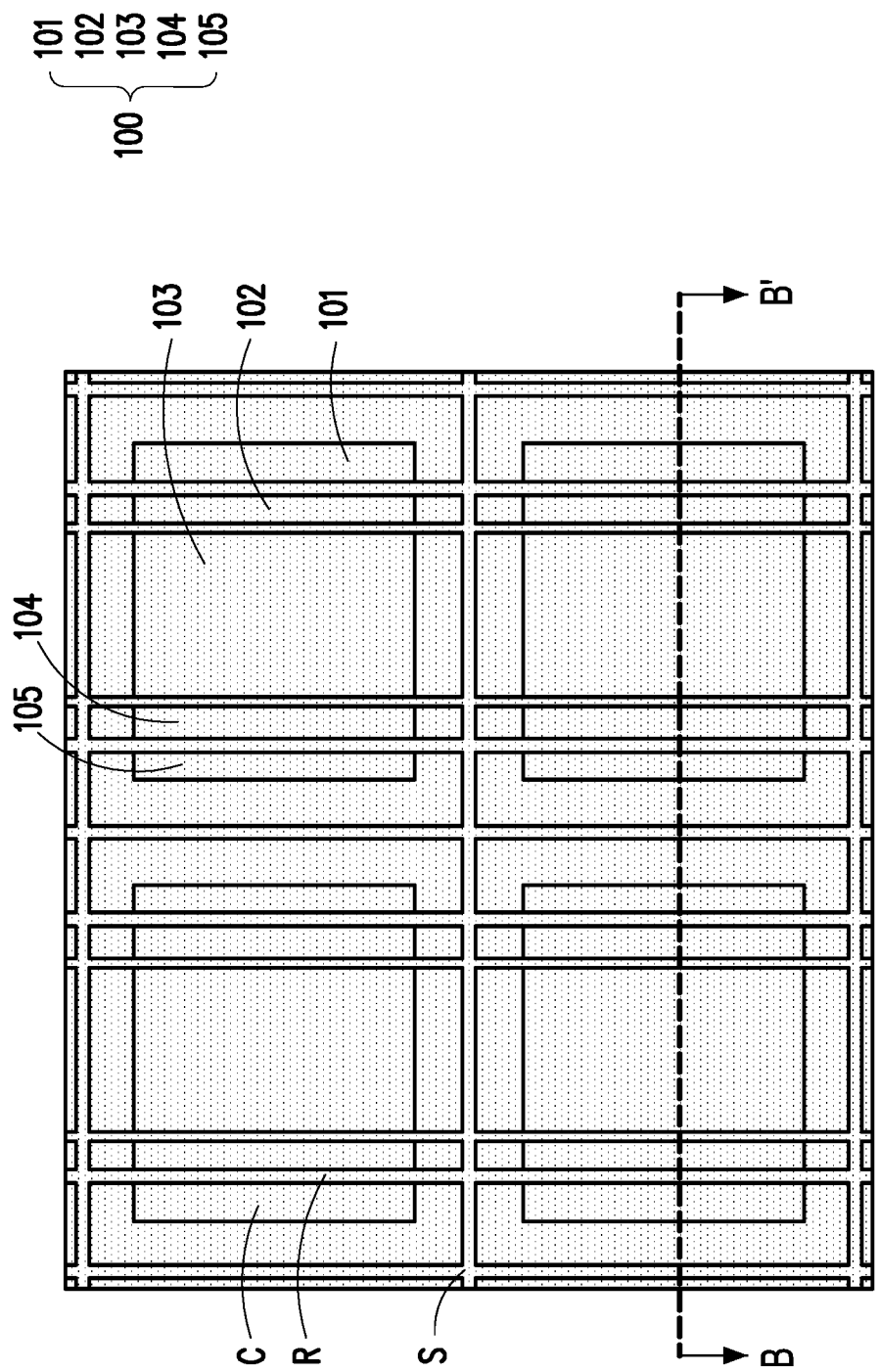
FIG. 3 is a top view of an intermediate step in a manufacturing method of a package structure shown in FIG. 1C according to an embodiment of the disclosure.
Figure 4:
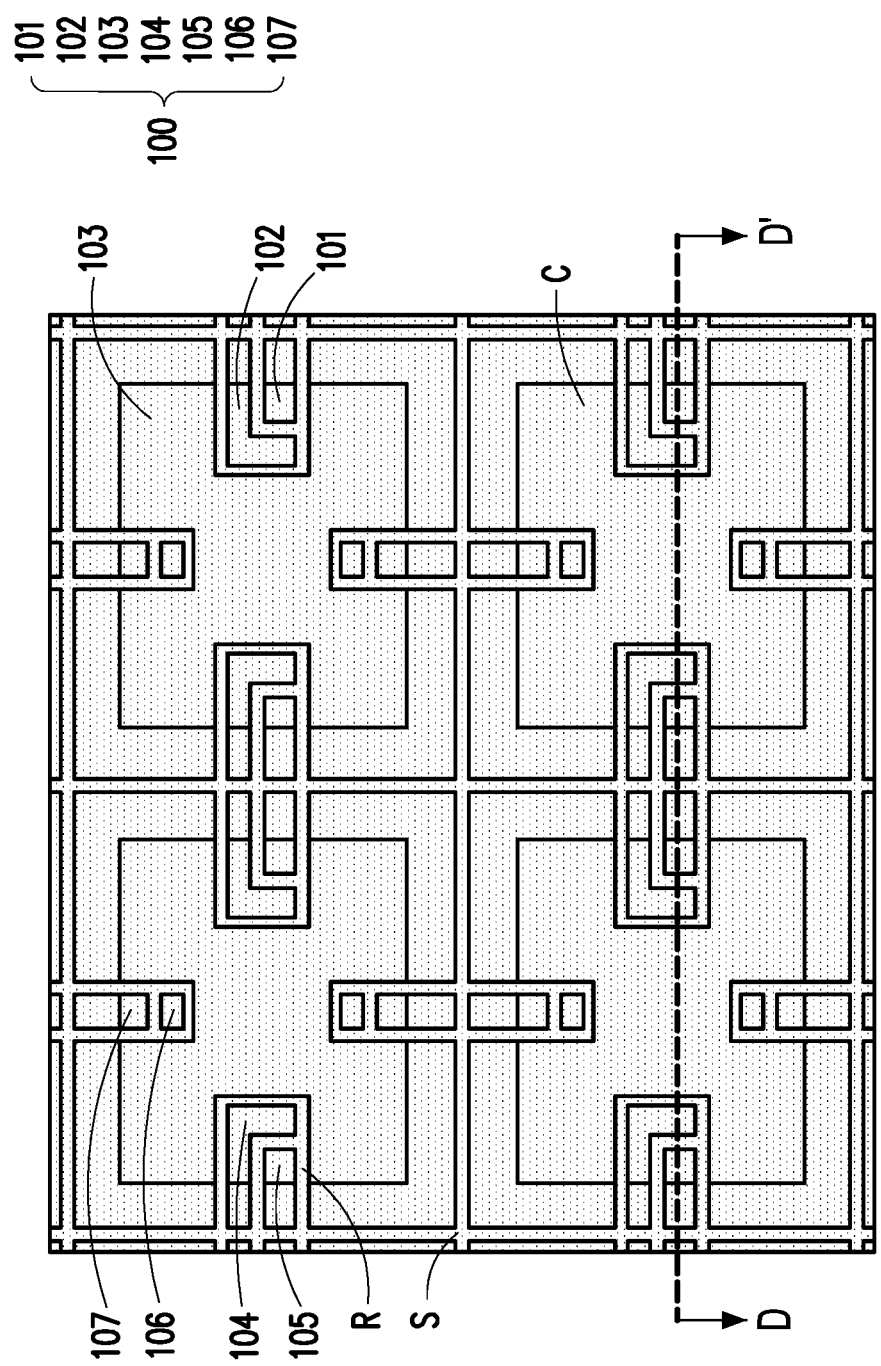
FIG. 4 is a top view of an intermediate step in a manufacturing method of a package structure shown in FIG. 1C according to an alternative embodiment of the disclosure.

Referring to FIG. 1C, a portion of the frame structure 100 may be further removed or the frame structure 100 may be further shaped to form a recess R in the frame structure 100. For example, the frame structure 100 may be etched or punched to form the recess R. In some embodiments, the recess R may be formed in the same step as forming the cavity C. The recess R may be formed in the body 100b and the protrusions 100p of the frame structure 100. For example, the recess R may extend to a level below the bottom surface of cavity C. In some embodiments, a plurality of recesses R may be formed. The recess R as viewed from above may take the form of different shapes in different embodiments. FIG. 3 is a top view of an intermediate step in a manufacturing method of a package structure 10 shown in FIG. 1C according to an embodiment of the disclosure. FIG. 4 is a top view of an intermediate step in a manufacturing method of a package structure 10 shown in FIG. 1C according to an alternative embodiment of the disclosure. It should be noted that the cross-sectional view shown in FIG. 1C corresponds to cross-sectional line B-B' in FIG. 3 and cross-sectional line D-D' in FIG. 4. The recess R may extend between two or more ends, each end coinciding with a lateral edge of the frame structure 100. For example, the recesses R may be formed as parallel straight strips extending from opposite edges of the frame structure 100 as shown in FIG. 3. Alternatively, the recesses R may have a first segment and a second segment, and the first segment and the second segment extend along different directions. For example, the recesses R may extend in two directions perpendicular to each other between two or more ends as shown in FIG. 4. However, the disclosure is not limited thereto.

As shown in FIG. 3, the recesses R divide the frame structure into a first portion 101, a second portion 102, a third portion 103, a fourth portion 104, and a fifth portion 105. However, the disclosure is not limited thereto. The number of portions of the frame structure 100 may be less than or more than five. For instance, FIG. 4 shows that the frame structure 100 further has a sixth portion 106 and a seventh portion 107. As shown in FIG. 3, the first portion 101, the second portion 102, the third portion 103, the fourth portion 104, and the fifth portion 105 are arranged side by side in a sequential order. Alternatively, the first portion 101, the second portion 102, the third portion 103, the fourth portion 104, the fifth portion 105, the sixth portion 106, and the seventh portion 107 may form groups arranged along different edges of the frame structure 100, as shown in FIG. 4. At this stage, the first portion 101, the second portion 102, the third portion 103, the fourth portion 104, and the fifth portion 105 illustrated in FIG. 3 are still connected to each other by the portion of the frame structure 100 having the recess R. Similarly, the first portion 101, the second portion 102, the third portion 103, the fourth portion 104, the fifth portion 105, the sixth portion 106, and the seventh portion 107 illustrated in FIG. 4 are also still connected to each other by the portion of the frame structure 100 having the recess R.

Figure 1D:
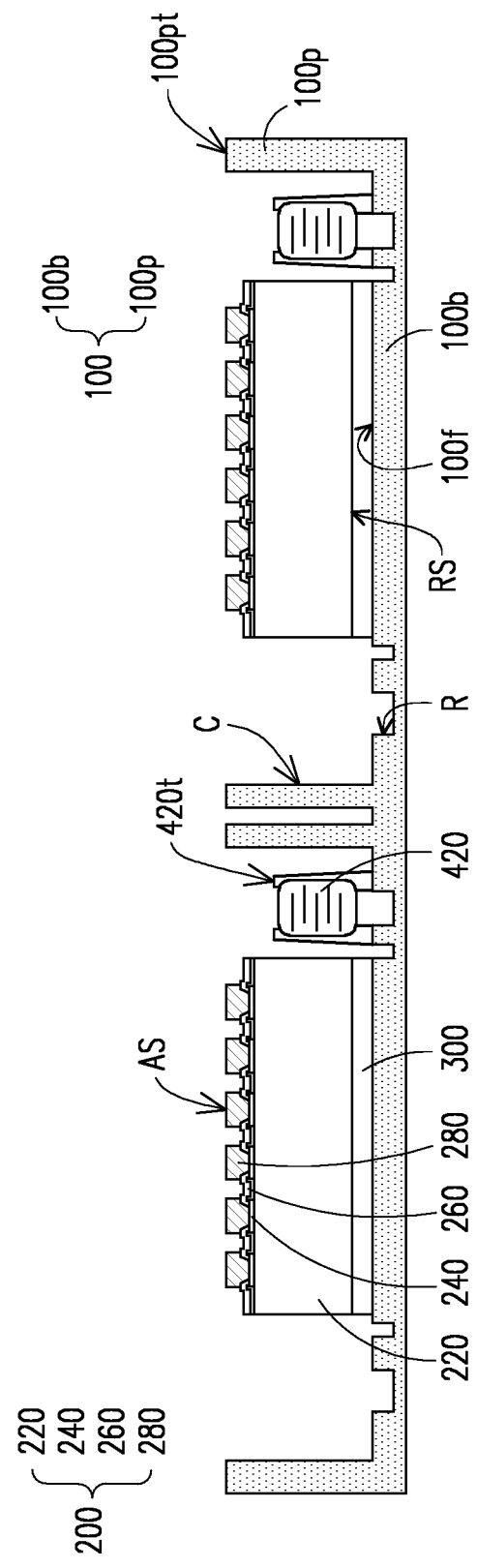

Referring to FIG. 1D, a die 200 is placed in the cavity C of the frame structure 100. In some embodiments, more than one die 200 may be placed in each of the cavities C of the frame structure 100. The dies 200 may include digital dies, analog dies, or mixed signal dies. For example, the dies 200 may be application-specific integrated circuit (ASIC) dies, logic dies, or other suitable dies.

The die 200 includes a semiconductor substrate 220, a plurality of conductive pads 240, a passivation layer 260, and a plurality of conductive connectors 280. In some embodiments, the semiconductor substrate 220 may be a silicon substrate having active components and, optionally, passive components formed therein. Examples of the active components include transistors or the like. Examples of the passive components include resistors, capacitors, inductors, or the like. The conductive pads 240 are distributed over the semiconductor substrate 220 of the die 200. In some embodiments, the conductive pads 240 may include aluminum pads, copper pads, or other suitable metal pads. The passivation layer 260 is formed over the semiconductor substrate 220 and may partially cover each conductive pad 240. The passivation layer 260 has a plurality of contact openings revealing at least a portion of each conductive pad 240. The passivation layer 260 may be a silicon oxide layer, a silicon nitride layer, a silicon oxy-nitride layer, or a dielectric layer formed of polymeric materials or other suitable dielectric materials. The conductive connectors 280 are disposed on the conductive pads 240. For example, the conductive connectors 280 may extend into the contact openings of the passivation layer 260 to render electrical connection with the conductive pads 240. In some embodiments, the conductive connectors 280 may be plated onto the conductive pads 240. The plating process is, for example, electro-plating, electroless-plating, immersion plating, or the like. The conductive connectors 280 may take the form of conductive posts, conductive pillars, or conductive bumps. A material of the conductive connectors 280 includes copper, aluminum, tin, gold, silver, alloys thereof, or other suitable conductive materials.

In some embodiments, the die 200 has an active surface AS and a rear surface RS opposite to the active surface AS. In some embodiments, the die 200 is disposed such that the active surface AS of the die 200 faces upward and away from the bottom surface of the cavity C of the frame structure 100, as shown in FIG. 1D. In some embodiments, the die 200 is placed on the bottom surface of the cavity C (the first surface 100f of the frame structure 100) to cover areas of the bottom surface of the cavity C not having the recess R. For example, the die 200 is placed on a third portion 103 of the frame structure 100, the third portion 103 being the portion of the frame structure 100 located in the center of the cavity C (shown in FIG. 3 and FIG. 4). In some embodiments, the die 200 is placed such that the active surface AS of the die 200 is located at substantially a same level height as that of top surfaces 100pt of the protrusions 100p of the frame structure 100. However, the disclosure is not limited thereto.

In some embodiments, the die 200 may be attached to the frame structure 100 through an adhesive layer 300. For example, the adhesive layer 300 may be disposed on the rear surface RS of the die 200 such that the adhesive layer 300 is sandwiched between the semiconductor substrate 220 of the die 200 and the bottom surface of the cavity C of the frame structure 100. In some alternative embodiments, the adhesive layer 300 may be formed on the bottom surface of the cavity C of the frame structure 100 prior to the attachment of the die 200. In some embodiments, the adhesive layer 300 is in physical contact with the bottom surface of the cavity C. The adhesive layer 300 may temporarily enhance the adhesion between the die 200 and the frame structure 100 to prevent die shift. Other properties of the adhesive layer 300 may include good electrical insulation, and good thermal dissipation. For example, the adhesive layer 300 may include a die attach film (DAF), a thermal interface material (TIM), an epoxy, or other suitable adhesive materials. In some embodiments, the adhesive layer 300 may be a dry film and may be adhered to the frame structure 100 through a lamination process. Alternatively, a solution of the adhesive layer 300 (liquid type) may be coated onto the frame structure 100 through a coating process. Subsequently, the solution is dried or cured to form a solid layer of the adhesive layer 300. The adhesive layer 300 may be made of B-stage materials. For example, the adhesive layer 300 may include resins such as with a die attach film (DAF). However, the disclosure is not limited thereto. In some alternative embodiments, other materials having adhesion properties may be adapted as the material for the adhesive layer 300.

In some embodiments, a passive component 420 may be disposed in the cavity C and attached to the frame structure 100. The passive component 420 may be a capacitor, inductor, resistor, or other suitable passive component. For example, the passive component 420 may be a multi-layer ceramic capacitor (MLCC), as shown in FIG. 1D. The passive component 420 may be surface mounted onto the frame structure. For example, the passive component 420 may be surface mounted on the bottom surface of the cavity C of the frame structure 100. The passive component 420 may have two terminals attached to two different portions of the frame structure 100. For example, one terminal of the passive component 420 may be attached to a first portion 101 (shown in FIG. 3 and FIG. 4) of the frame structure 100 and the other terminal may be attached to a second portion 102 (shown in FIG. 3 and FIG. 4) of the frame structure 100. The terminals of the passive component 420 may be attached to the frame structure 100 by a soldering process. For example, the soldering process may be performed at soft soldering temperatures using the reflow soldering process using a suitable solder. In some embodiments, a top surface 420t of the passive component 420 furthest away and facing away from the bottom surface of the cavity C of the frame structure 100 is substantially level with or lower than the top surfaces 100pt of the protrusions 100p of the frame structure 100 and the active surface AS of the die 200.

Referring to FIG. 1E, an encapsulation material 600m is formed on the frame structure 100 to fill the cavity C, so as to cover the frame structure 100, the die 200, and the passive component 420. In other words, the encapsulation material 600m encapsulates the die 200 and the passive component 420. The encapsulation material 600m may include a molding compound formed by a molding process or an insulating material such as epoxy, silicone, or other suitable resins. In some embodiments, the encapsulation material 600m is formed by an over-molding process such that the die 200 and the passive component 420 are not exposed. For example, as illustrated in FIG. 1E, a top surface 600mt of the encapsulation material 600m is located at a level height higher than the height of the top surfaces 100pt of the protrusions 100p of the frame structure 100, the active surface AS of the die 200, and the top surface 420t of the passive component 420.

Referring to FIG. 1F, a thickness of the encapsulation material 600m is reduced to form an encapsulant 600. For example, a portion of the encapsulation material 600m is removed until at least the protrusions 100p of the frame structure 100 and the conductive connectors 280 of the die 200 are exposed. In some embodiments, the portion of the encapsulation material 600m may be removed through a first planarization process. The first planarization process includes, for example, chemical mechanical polishing (CMP), mechanical grinding, etching, or other suitable process. In some embodiments, the first planarization process may further grind the protrusion 100p of the frame structure 100, the conductive connectors 280 of the die 200, and the encapsulation material 600m to reduce the overall thickness of the subsequently formed package structure 10. After the first planarization process, the encapsulant 600 is formed to fill the cavity C of the frame structure 100 and laterally encapsulate the die 200 and the passive component 420. In some embodiments, a top surface 600t of the encapsulant 600, the top surfaces 100pt of the protrusions 100p of the frame structure 100, and the active surface AS of the die 200 are substantially coplanar to each other.

Figure 1G:
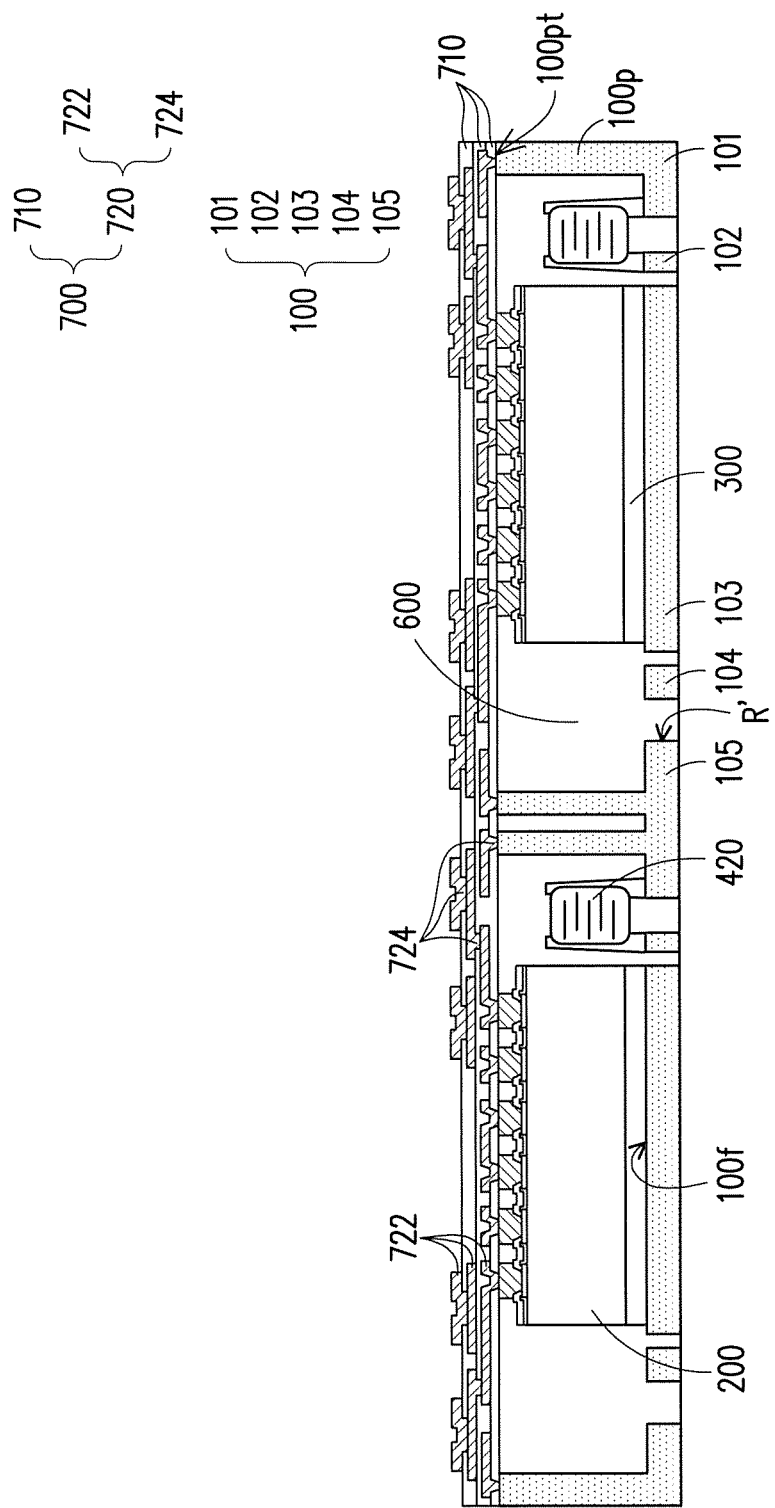

Referring to FIG. 1G, a thickness of the frame structure 100 is reduced to expose the recess R filled with the encapsulant 600 and form an opening R'. In some embodiments, a portion of the frame structure 100 may be removed through a second planarization process. The second planarization process may, as with the first planarization process, include chemical mechanical polishing (CMP), mechanical grinding, etching, or other suitable process. In some embodiments, the second planarization process may further grind the body 100b of the frame structure 100 and the encapsulation 600 to reduce the overall thickness of the subsequently formed package structure 10. After the second planarization process, the first portion 101, the second portion 102, the third portion 103, the fourth portion 104, and the fifth portion 105 of the frame structure 100 are physically separated. However, the disclosure is not limited to five separate portions of the frame structure 100. The number of separate portions of the frame structure may be less than or more than five. For instance, the sixth portion 106 and a seventh 107 portion shown in FIG. 4 are also separated from each other and from the first portion 101, the second portion 102, the third portion 103, the fourth portion 104, and the fifth portion 105 after the second planarization process. The sixth portion 106 and the seventh portion 107 of the frame structure 100 may be used for connection to additional passive components. Although the number of separate portions of the frame structure 100 is shown as an odd number in FIG. 3 and FIG. 4, the disclosure is not limited thereto. The number of separate portions of the frame structure 100 may also be even. For example, one of the terminals of a passive component 420 may be attached to the third portion 103 where the die 200 is disposed on, thereby eliminating the second portion 102 to obtain an even number of separate portions.

As illustrated in FIG. 1G, a redistribution structure 700 is formed on the frame structure 100, the die 200, and the encapsulant 600. The redistribution structure 700 may include at least one dielectric layer 710 and a plurality of conductive elements 720. In some embodiments, the plurality of conductive elements 720 may provide electrical connection to the die 200 at the active surface AS. The plurality of conductive elements 720 may also provide electrical connection to passive components attached to the frame structure 100 through one or more of the plurality of portions of the frame structure 100. For example, the conductive elements 720 of the redistribution structure 700 may connect to the first portion 101 (shown in FIG. 1G) and the second portion 102 (out of plane of cross-section shown in FIG. 1G) at the top surfaces 100pt of the protrusions 100p of the frame structure 100, thereby rendering electrical connection with the passive component 420.

The plurality of conductive elements 720 may include a plurality of conductive patterns 722 and a plurality of conductive vias 724. The dielectric layers 710 may be formed by suitable fabrication techniques such as spin-on coating, chemical vapor deposition (CVD), plasma-enhanced chemical vapor deposition (PECVD), or the like. The dielectric layers 710 may be made of non-organic or organic dielectric materials such as silicon oxide, silicon nitride, silicon carbide, silicon oxynitride, polyimide, benzocyclobutene (BCB), or the like. On the other hand, the conductive elements 720 may be formed by sputtering, evaporation, electro-less plating, or electroplating. The conductive elements 720 are embedded in the dielectric layers 710. The dielectric layers 710 and the conductive patterns 722 of the conductive elements 720 may be stacked alternately. The conductive vias 724 of the conductive elements 720 penetrate through the dielectric layers 710 to electrically connect the conductive patterns 722 to each other. The conductive elements 720 may be made of copper, aluminum, nickel, gold, silver, tin, a combination thereof, a composite structure of copper/nickel/gold, or other suitable conductive materials.

The redistribution structure 700 may be used to reroute electrical signals to/from the die 200 through conductive pathways formed by the conductive elements 720. In some embodiments, the conductive pathways to/from the die 200 may expand to a wider area than that of the die 200. In such embodiments, the redistribution structure 700 may be referred to as a "fan-out redistribution structure".

The redistribution structure 700 may provide a conductive pathway to/from one or more passive components, such as the passive component 420, through at least one portion of the frame structure 100. For example, the redistribution structure 700 may connect to at least one of the first to fifth portions 101-105 of the frame structure 100 (shown in FIG. 3) at corresponding locations of the top surfaces 100pt of the protrusions 100p of the frame structure 100. In another example corresponding to FIG. 4, the redistribution structure 700 may connect to at least one of the first to fifth and seventh portions 101-105, 107 of the frame structure 100 at corresponding locations of the top surfaces 100pt of the protrusions 100p of the frame structure 100. The sixth portion 106 of the frame structure 100 corresponds solely to a portion of the body 100b of the frame structure 100 without any protrusions. In other words, the sixth portion 106 of the frame structure 100 may be an island structure. The isolated sixth portion 106 would imply, for example, that a passive component attached between the sixth portion 106 and the seventh portion 107 would only have one of its terminals connected to the redistribution structure 700.

As illustrated in FIG. 1G, the redistribution structure 700 includes three dielectric layers 710. However, the number of the dielectric layers 710 is not limited and may be adjusted based on circuit design. The bottommost dielectric layer 710 may have a plurality of contact openings partially exposing at least one portion of the frame structure 100 and the conductive connectors 280 of the die 200. For example, the contact openings may expose the protrusions 100p of the frame structure. The conductive vias 724 disposed in the contact openings may be directly in contact with the top surfaces 100pt of the protrusions 100p of the frame structure 100 and with the conductive connectors 280 of the die 200. In other words, the conductive connectors 280 of the die 200 are directly in contact with the redistribution structure 700 to render the electrical connection between the die 200 and the redistribution structure 700. Similarly, the protrusions 100p of the frame structure 100 are also directly in contact with the redistribution structure 700 to render the electrical connection between one or more passive components and the redistribution structure 700. For example, the first portion 101 and the second portion 102 of the frame structure 100 may be in direct contact with the redistribution structure 700 to render electrical connection between the passive component 420 and the redistribution structure 700. It should be noted that although in FIG. 1G, the second portion 102 is shown as separated from the redistribution structure 700, the second portion 102 is actually connected to the redistribution structure 700 out of the cross-sectional plane shown in FIG. 1G.

Bottommost conductive patterns 722 may be disposed on the bottommost dielectric layer 710. The middle dielectric layers 710 expose part of the bottommost conductive patterns 722 such that the bottommost conductive patterns 722 may be electrically connected to other conductive patterns 722 (for example, the middle conductive patterns 722) through other conductive vias 724. The topmost dielectric layer 710 has a plurality of contact openings exposing a portion of the middle conductive patterns 722. The topmost conductive vias 724 may extend into the contact openings of the top dielectric layer 710 to electrically connect the middle conductive patterns 722 to the topmost conductive patterns 722 disposed on the topmost dielectric layer 710. The topmost conductive patterns 722 provide further onward electrical connection in subsequent processes. In some embodiments, the topmost conductive patterns 722 may be referred to as under-bump metallization (UBM) patterns.

Figure 1H:
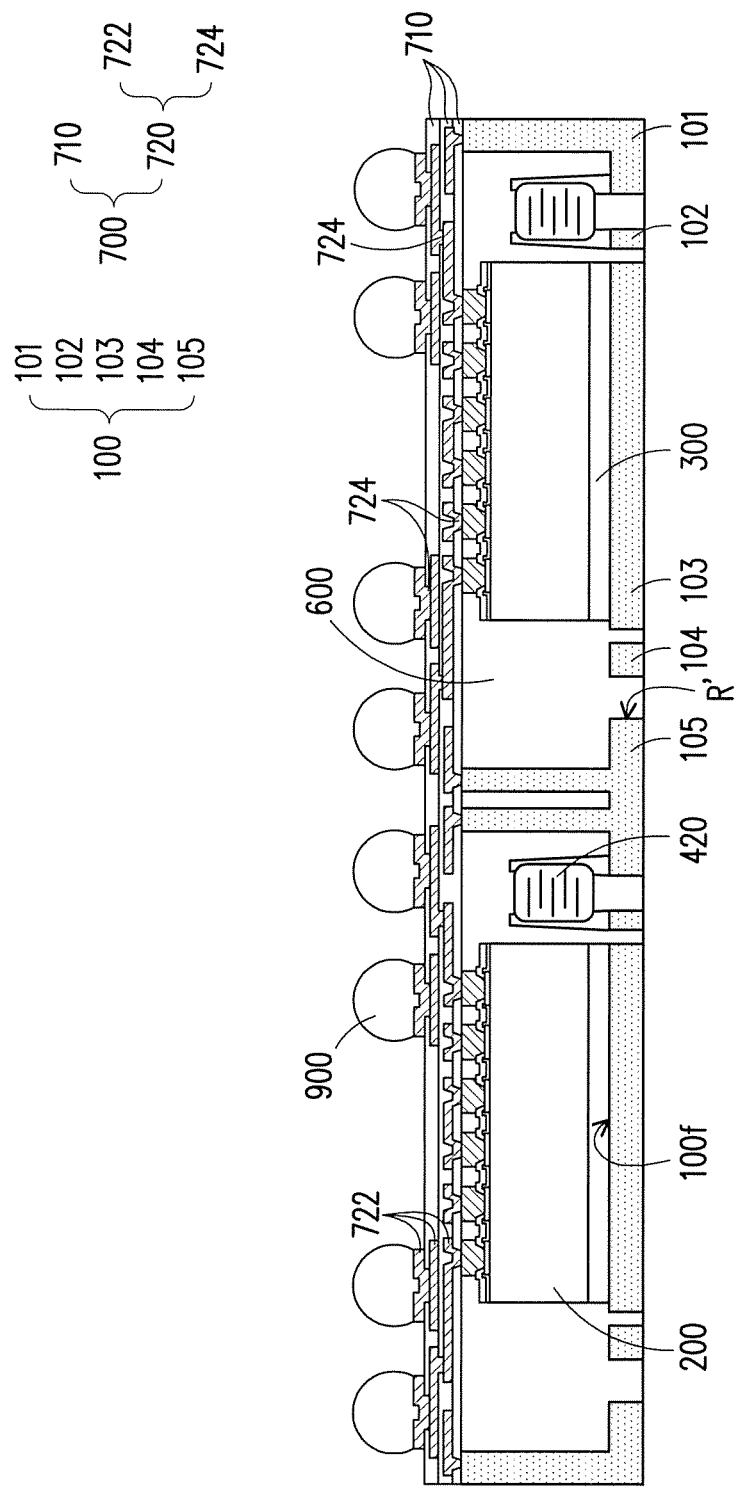

Referring to FIG. 1H, a plurality of conductive terminals 900 is formed on the redistribution structure 700 opposite to the die 200 and the passive component 420. In some embodiments, the conductive terminals 900 are disposed on the UBM patterns (the topmost conductive patterns 722 in FIG. 1H) of the redistribution structure 700. The conductive terminals 900 may be formed by a ball placement process and/or a reflow process. The conductive terminals 900 may be conductive bumps, such as solder balls. However, the disclosure is not limited thereto. In some alternative embodiments, the conductive terminals 900 may take other possible forms and shapes based on design requirements. For example, the conductive terminals 900 may take the form of conductive pillars or conductive posts.

Figure 1I:
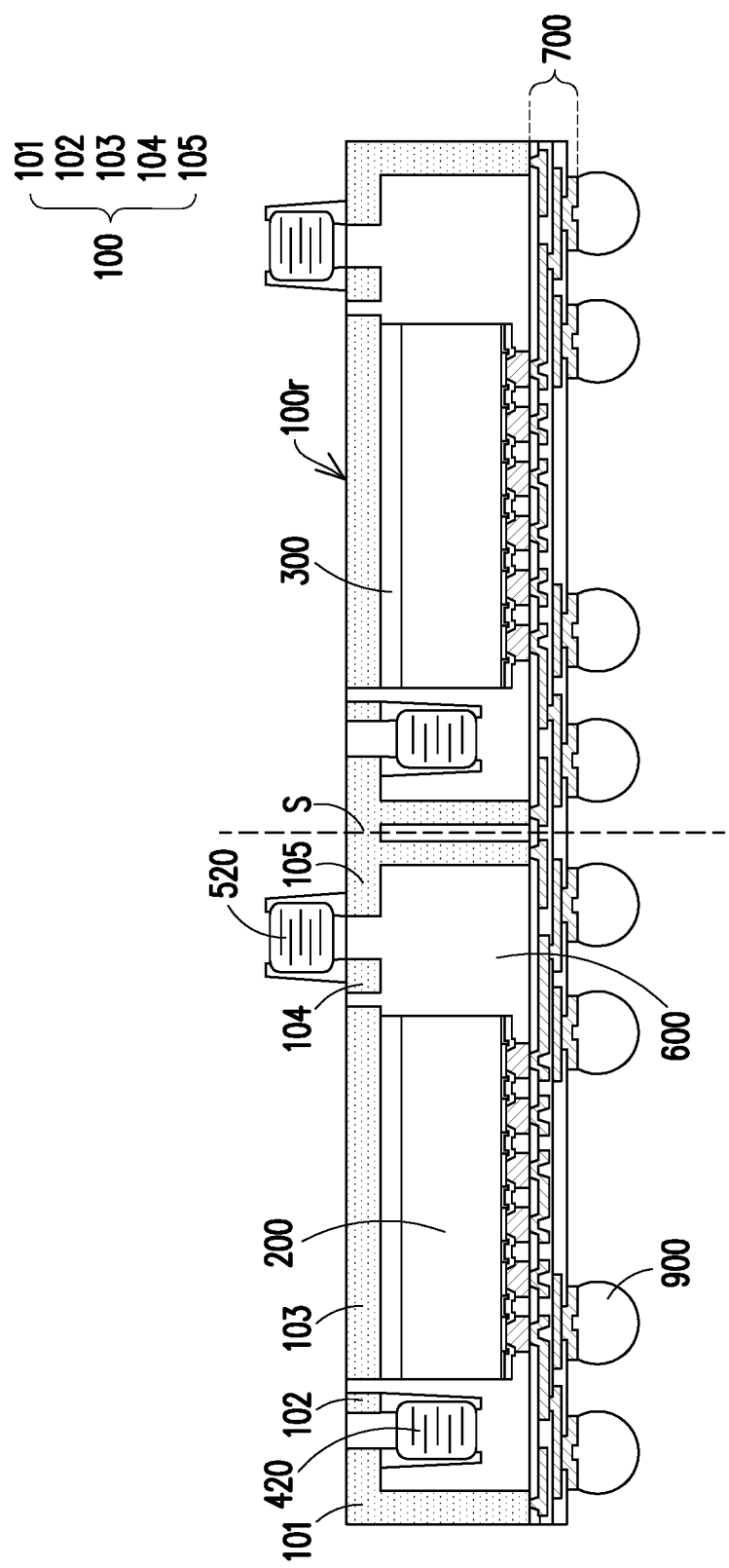

Referring to FIG. 1I, in some embodiments, a passive component 520 may be attached to the frame structure 100 outside the cavity C of the frame structure 100. For example, the passive component 520 may be attached to the second surface 100r of the frame structure 100. The passive component 520 may be attached by the following steps. The structure illustrated in FIG. 1H is flipped upside down such that the die 200, the encapsulant 600, and the passive component 420 are shown to be disposed on/above the redistribution structure 700. Thereafter, the passive component 520 may be surface mounted on the second surface 100r of the frame structure 100. Similar to the passive component 420, the passive component 520 may have two terminals respectively attached to adjacent portions of the frame structure 100. As shown in FIG. 1I, one terminal of the passive component 520 is attached to the fourth portion 104 of the frame structure 100 and the other terminal is attached to the fifth portion 105 of the frame structure 100. The terminals of the passive component 520 may be attached to the frame structure 100 by soldering, for example at soft soldering temperatures using the reflow soldering process using a suitable solder. Similar to the passive component 420, the passive component 520 may be a capacitor, inductor, resistor, or other suitable passive component. The passive component 520 may be the same as or different from the passive component 420.

Figure 1J:
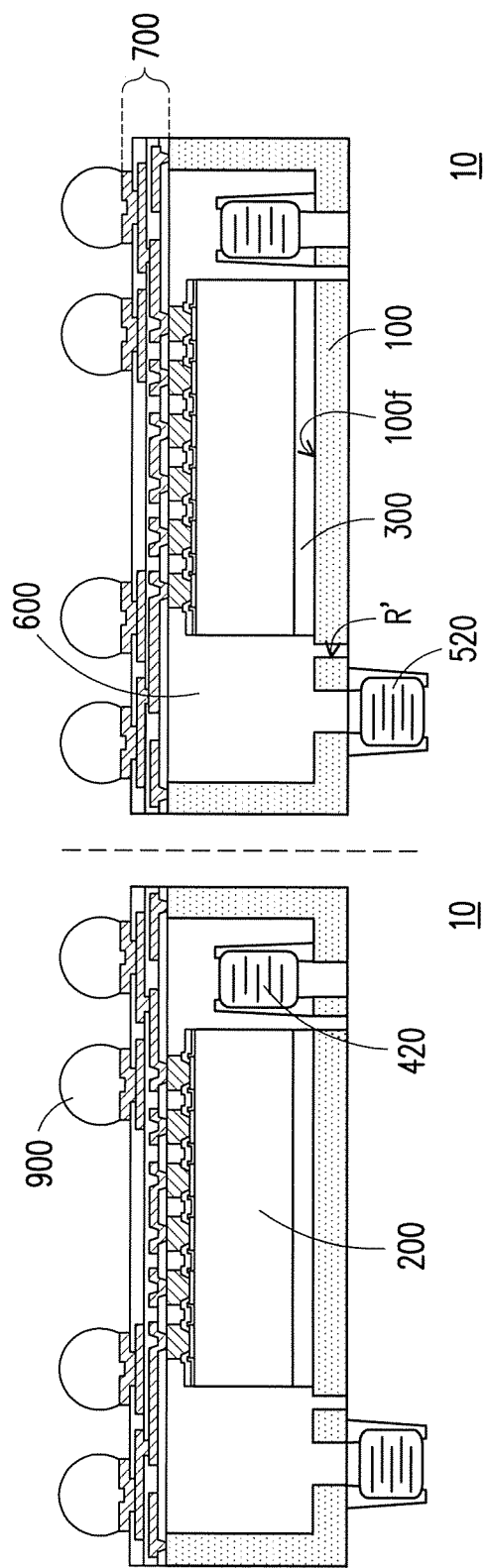

Referring to FIG. 1I and FIG. 1J, a singulation process is performed to obtain a plurality of package structures 10. In some embodiments, the singulation process may be performed on the scribe line S of the frame structure 100. The singulation process includes, for example, cutting with a rotating blade or a laser beam.

FIG. 1J shows the package structure 10 having two passive components, in which the passive component 420 is inside the cavity C of the frame structure 100 and the passive component 520 is outside the cavity C of the frame structure 100. However, the disclosure is not limited thereto. There may be fewer or more passive components attached to the frame structure 100. For instance, an additional passive component may be attached to the sixth portion 106 and the seventh portion 107 of the frame structure 100 (the sixth portion 106 and the seventh portion 107 are shown in FIG. 4). Also, each passive component may be attached to the frame structure 100 either inside or outside the cavity C of the frame structure 100, independent of the other passive components. Other configurations of the passive components will be discussed below in conjunction with FIG. 5 and FIG. 6.

Figure 5:
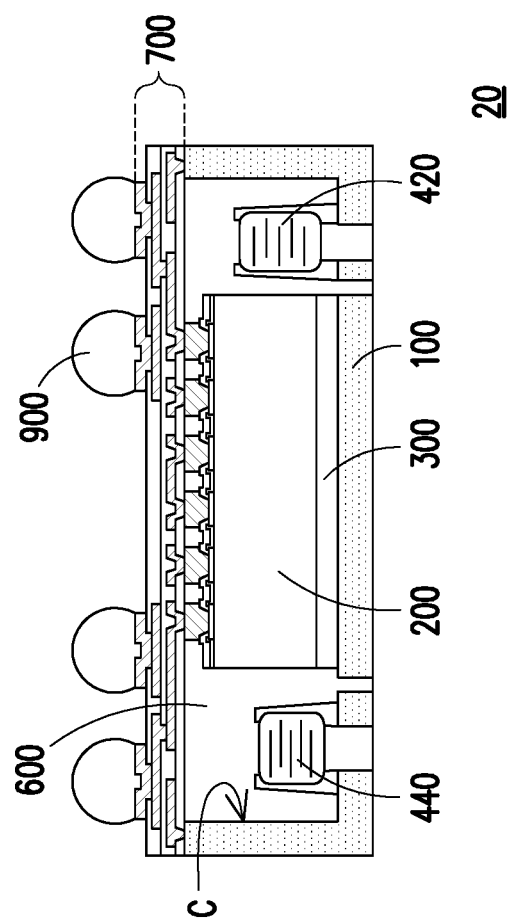
FIG. 5 is a schematic cross-sectional view of a package structure according to an alternative embodiment of the disclosure.
Figure 6:
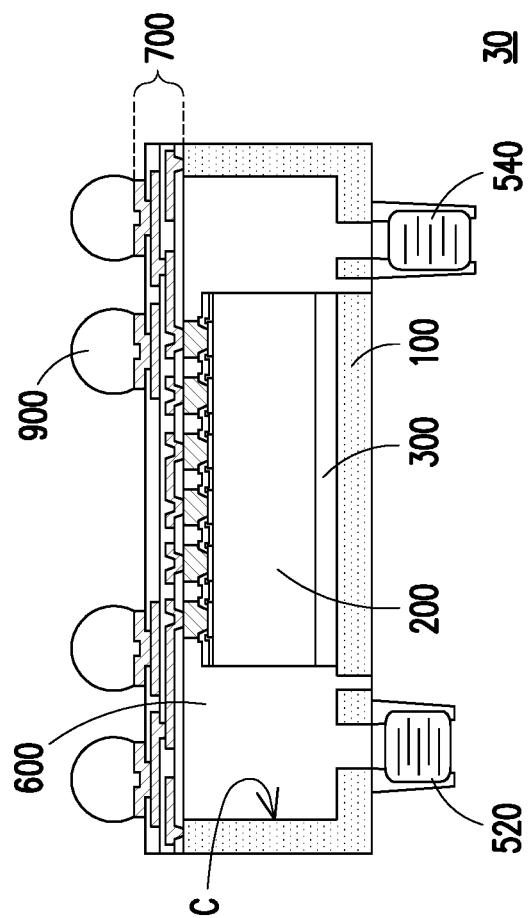
FIG. 6 is a schematic cross-sectional view of a package structure according to an alternative embodiment of the disclosure.

FIG. 5 is a schematic cross-sectional view of a package structure 20 according to an alternative embodiment of the disclosure. FIG. 6 is a schematic cross-sectional view of a package structure 30 according to an alternative embodiment of the disclosure. As illustrated in FIG. 5, both of the passive component 420 and the passive component 440 are attached to the frame structure 100 inside the cavity C. On the other hand, FIG. 6 illustrates that the passive component 520 and the passive component 540 are attached to the frame structure 100 outside the cavity C.

Based on the above, the frame structure within the package structure serves as electrical connection between the one or more integrated passive components and the redistribution structure. Thus, the conventional use of conductive pillars for connection through the encapsulation layer to the redistribution layer may be eliminated. In other words, the costly tall pillar plating process in a conventional manufacturing process of the package structure may be removed to reduce the cost of fabrication. The frame structure may also serve as a carrier during the manufacturing process of the package structure. Thus, the use of a temporary carrier may be eliminated. In other words, the costly transfer bonding process performed in the conventional manufacturing process of the package structure may be removed to reduce the cost of fabrication. Moreover, since the frame structure may be formed by rigid materials, the frame structure is able to provide rigidity and strength to the package structure, while keeping the package structure thin. As such, the problems of panel warpage and package chipping/breaking/cracking may be sufficiently prevented, thereby increasing the yield and the reliability of the package structure. The frame structure may also serve the function of heat dissipation. Heat may be dissipated from the passive component and the die through the frame structure. The adhesive layer sandwiched between the rear surface of the die and the frame structure may include a thermal interface material (TIM) or other suitable layer to aid in heat dissipation from the die through the adhesive layer and on to the frame structure. The frame structure may also serve the function of electromagnetic interference (EMI) shielding. For example, a portion of the frame structure may be electrically connected to an external ground through the terminals of the package structure via the redistribution structure. Alternatively, a portion of the frame structure may be electrically connected to the die and function as an integrated chassis ground for the die. In summary, these enhanced properties arising from the package structure and manufacturing method thereof herein disclosed result in an increased performance of the package structure having integrated passive components while maintaining or reducing the cost of manufacture.

It will be apparent to those skilled in the art that various modifications and variations can be made to the embodiments and concepts disclosed herein without departing from the scope or spirit of the invention. In view of the foregoing, it is intended that the present disclosure cover modifications and variations of this invention provided they fall within the scope of the following claims and their equivalents.

What is claimed is:

1. A package structure, comprising: a frame structure having a cavity; a die disposed in the cavity; an encapsulant filled into the cavity to encapsulate the die; a redistribution structure disposed on the encapsulant, the die and the frame structure, wherein the redistribution structure is electrically coupled to the die; and a passive component on the frame structure and electrically coupled to the frame structure directly and coupled to the redistribution structure through the frame structure, wherein the frame structure is a single layer structure.

2. The package structure according to claim 1, wherein
the frame structure comprises a first portion and a second portion disconnected from the first portion, and
the passive component comprises a first terminal electrically coupled to the first portion of the frame structure and a second terminal electrically coupled to the second portion of the frame structure.

3. The package structure according to claim 2, wherein
the first portion of the frame structure comprises a first body electrically coupled to the first terminal of the passive component and a first protrusion protruding from the first body and electrically coupled to the redistribution structure, and
the second portion of the frame structure comprises a second body electrically coupled to the second terminal of the passive component and a second protrusion protruding from the second body and electrically coupled to the redistribution structure.

4. The package structure according to claim 3, wherein a top surface of the encapsulant and a top surface of the first protrusion are substantially coplanar to each other.

5. The package structure according to claim 2, wherein the frame structure further comprises a third portion disconnected from the first portion and the second portion, wherein the third portion is disposed under the die.

6. The package structure according to claim 1, wherein the passive component is disposed in the cavity and encapsulated by the encapsulant.

7. The package structure according to claim 1, wherein the passive component is disposed on the frame structure opposite to the die and the encapsulant.

8. The package structure according to claim 1, further comprising an adhesive layer disposed between the die and the frame structure.

9. The package structure according to claim 1, wherein a material of the frame structure comprises copper, metallic alloy, steel, or a combination thereof.

10. The package structure according to claim 1, further comprising a plurality of conductive terminals disposed on the redistribution structure opposite to the die.

11. A package structure, comprising:
a frame structure having a cavity;
a die disposed in the cavity;
an encapsulant filled into the cavity to encapsulate the die;
a redistribution structure disposed on the encapsulant, the die and the frame structure, wherein the redistribution structure is electrically coupled to the die; and
a passive component on the frame structure and electrically coupled to the redistribution structure through the frame structure, wherein the frame structure is a single layer structure.

12. The package structure according to claim 11, wherein
the frame structure comprises a first portion and a second portion disconnected from the first portion, and
the passive component comprises a first terminal electrically coupled to the first portion of the frame structure and a second terminal electrically coupled to the second portion of the frame structure.

13. The package structure according to claim 12, wherein
the first portion of the frame structure comprises a first body electrically coupled to the first terminal of the passive component and a first protrusion protruding from the first body and electrically coupled to the redistribution structure, and
the second portion of the frame structure comprises a second body electrically coupled to the second terminal of the passive component and a second protrusion protruding from the second body and electrically coupled to the redistribution structure.

14. The package structure according to claim 13, wherein a top surface of the encapsulant and a top surface of the first protrusion are substantially coplanar to each other.

15. The package structure according to claim 12, wherein the frame structure further comprises a third portion disconnected from the first portion and the second portion, wherein the third portion is disposed under the die.

16. The package structure according to claim 11, wherein the passive component is disposed in the cavity and encapsulated by the encapsulant.

17. The package structure according to claim 11, wherein the passive component is disposed on the frame structure opposite to the die and the encapsulant.

18. The package structure according to claim 11, further comprising an adhesive layer disposed between the die and the frame structure.

19. The package structure according to claim 11, wherein a material of the frame structure comprises copper, metallic alloy, steel, or a combination thereof.

20. The package structure according to claim 11, further comprising a plurality of conductive terminals disposed on the redistribution structure opposite to the die.

* * * * *